(12) United States Patent
Zhang et al.

(10) Patent No.: US 11,960,989 B2
(45) Date of Patent: Apr. 16, 2024

(54) READ THRESHOLD ESTIMATION SYSTEMS AND METHODS USING DEEP LEARNING

(71) Applicant: SK hynix Inc., Gyeonggi-do (KR)

(72) Inventors: Fan Zhang, Fremont, CA (US); Aman Bhatia, Los Gatos, CA (US); Xuanxuan Lu, San Jose, CA (US); Meysam Asadi, Fremont, CA (US); Haobo Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 936 days.

(21) Appl. No.: 16/937,939

(22) Filed: Jul. 24, 2020

(65) Prior Publication Data

US 2022/0027721 A1   Jan. 27, 2022

(51) Int. Cl.
*G11C 29/00* (2006.01)
*G06F 3/06* (2006.01)
*G06N 3/08* (2023.01)

(52) U.S. Cl.
CPC ............. *G06N 3/08* (2013.01); *G06F 3/0604* (2013.01); *G06F 3/0659* (2013.01); *G06F 3/067* (2013.01)

(58) Field of Classification Search
CPC ....... G06N 3/08; G06F 3/0604; G06F 3/0659; G06F 3/067
See application file for complete search history.

(56) References Cited

U.S. PATENT DOCUMENTS

| | | |
|---|---|---|
| 7,558,109 B2 | 7/2009 | Brandman et al. |
| 8,370,719 B2 | 2/2013 | Nelson et al. |
| 8,947,958 B2 | 2/2015 | Mu et al. |
| 2008/0002468 A1 | 1/2008 | Hemink |
| 2009/0003058 A1 | 1/2009 | Kang |
| 2013/0238836 A1 | 9/2013 | Suzuki et al. |
| 2016/0132256 A1 | 5/2016 | Jung |
| 2017/0061281 A1 | 5/2017 | Gokmen et al. |
| 2017/0271031 A1* | 9/2017 | Sharon .................. G11C 29/52 |
| 2018/0060726 A1 | 3/2018 | Gokmen et al. |

(Continued)

FOREIGN PATENT DOCUMENTS

| | | |
|---|---|---|
| CN | 105512725 A | 4/2016 |
| CN | 108777157 A | 11/2018 |
| CN | 111538458 B | 6/2023 |

OTHER PUBLICATIONS

Office Action for the U.S. Appl. No. 16/717,888 issued by the USPTO dated Aug. 1, 2022.

(Continued)

*Primary Examiner* — Christine T. Tu

(74) *Attorney, Agent, or Firm* — IP & T GROUP LLP

(57) ABSTRACT

A controller estimates optimal read threshold values for a memory device using deep learning. The memory device includes multiple pages coupled to select word lines in a memory region. The controller performs multiple read operations on a select type of page for each word line using multiple read threshold sets, obtains fail bit count (FBC) information associated with each read operation, and determines an optimal read threshold set for each word line based on the FBC information. When optimal read threshold sets for the select word lines are different each other, the controller predicts a best read threshold set using the optimal read threshold sets.

20 Claims, 17 Drawing Sheets

(56) References Cited

U.S. PATENT DOCUMENTS

| | | |
|---|---|---|
| 2018/0143762 A1 | 5/2018 | Kim et al. |
| 2018/0246782 A1 | 8/2018 | Zeng et al. |
| 2018/0357535 A1 | 12/2018 | Shulkin et al. |
| 2018/0358110 A1 | 12/2018 | Buyuktosunoglu et al. |
| 2019/0004734 A1 | 1/2019 | Kirshenbaum et al. |
| 2019/0102084 A1* | 4/2019 | Zhang .................. G06F 11/008 |
| 2019/0172542 A1 | 6/2019 | Miladinovic |
| 2019/0180176 A1 | 6/2019 | Yudanov et al. |
| 2019/0267054 A1 | 8/2019 | Thalaimalaivanaraj et al. |
| 2019/0286516 A1 | 9/2019 | Jacobvitz et al. |
| 2020/0026470 A1 | 1/2020 | Yang |
| 2020/0027519 A1 | 1/2020 | Zhang et al. |
| 2020/0105353 A1* | 4/2020 | Sharon ................. G11C 29/021 |
| 2020/0176063 A1 | 6/2020 | Malshe et al. |
| 2020/0210831 A1 | 7/2020 | Zhang et al. |
| 2020/0388338 A1* | 12/2020 | Yang ................. G11C 16/0483 |
| 2021/0303474 A1 | 9/2021 | Ellis et al. |

OTHER PUBLICATIONS

Sze et al., Efficient Processing of Deep Neural Networks: A Tutorial and Survey, Proceedings of the IEEE, Dec. 2017, vol. 105, Issue: 12.
Office Action issued by the USPTO for U.S. Appl. No. 17/100,027 dated Sep. 8, 2021.
Notice of Allowance for U.S. Appl. No. 17/100,027 issued by the USPTO dated Mar. 16, 2022.

\* cited by examiner

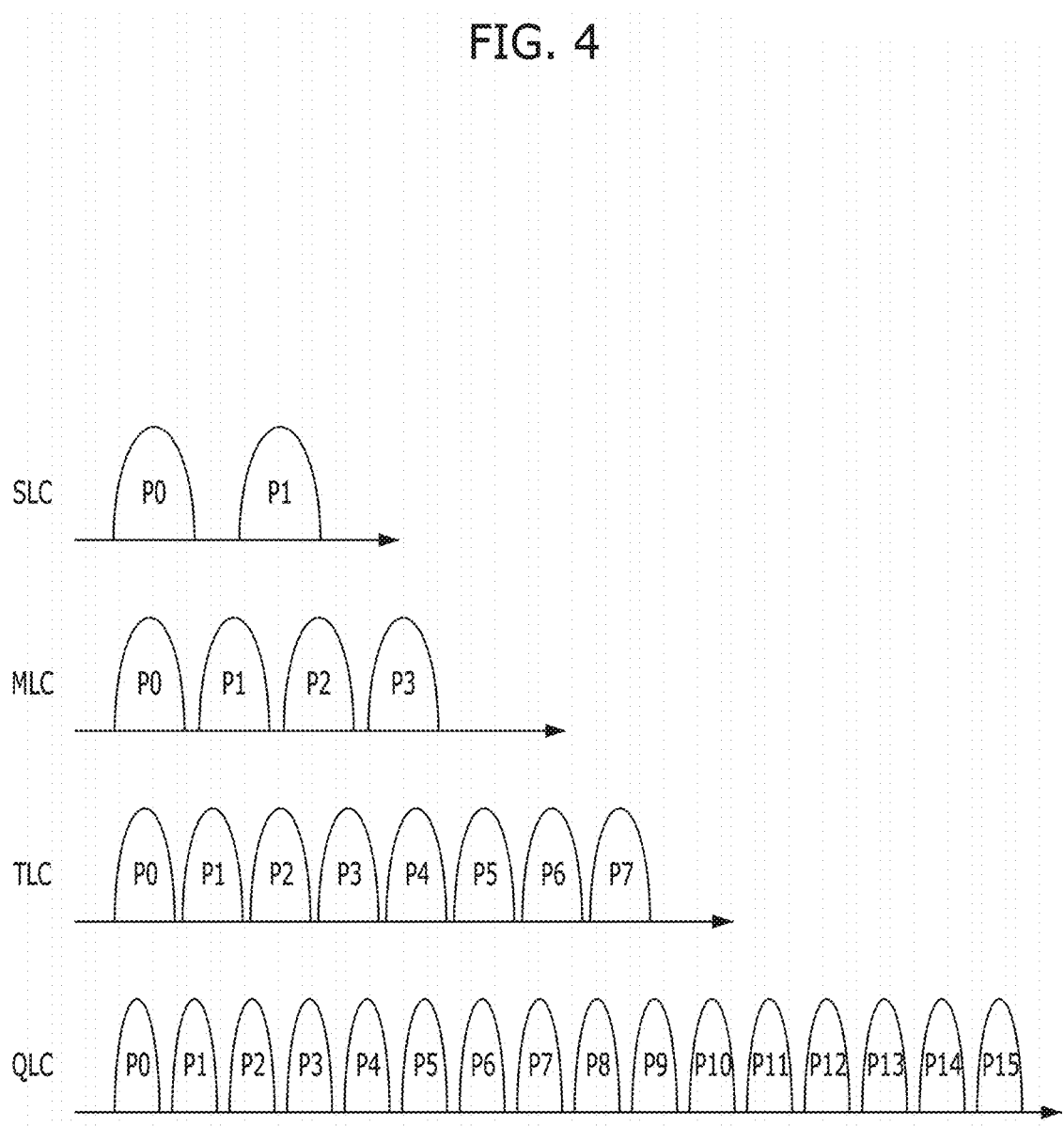

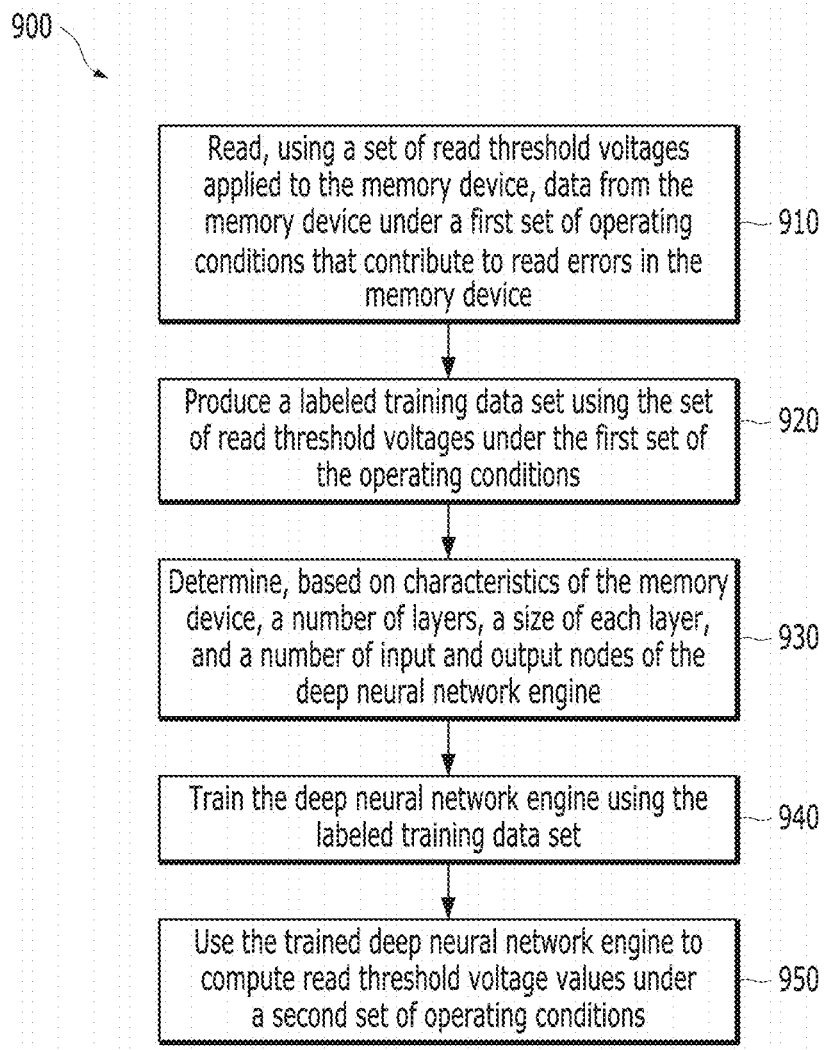

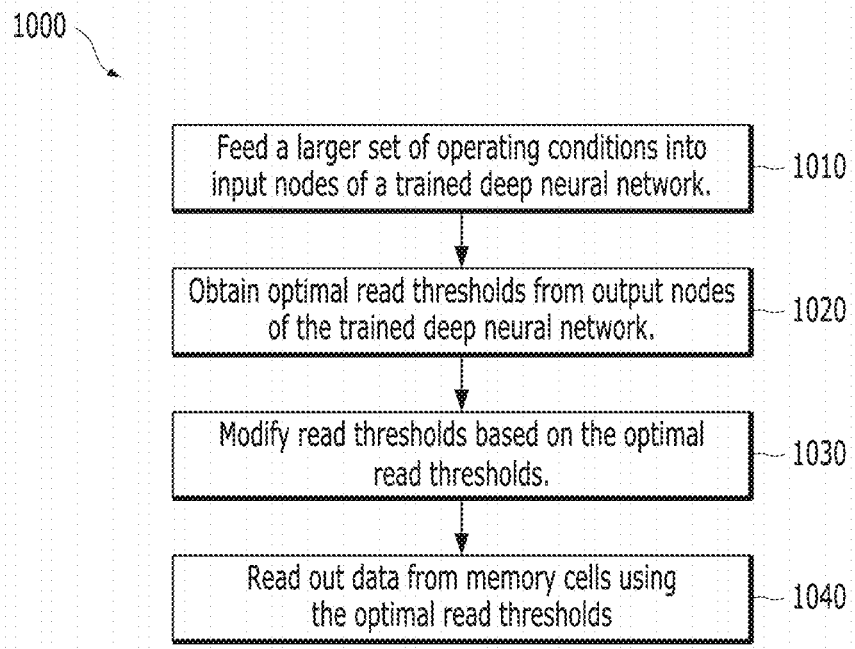

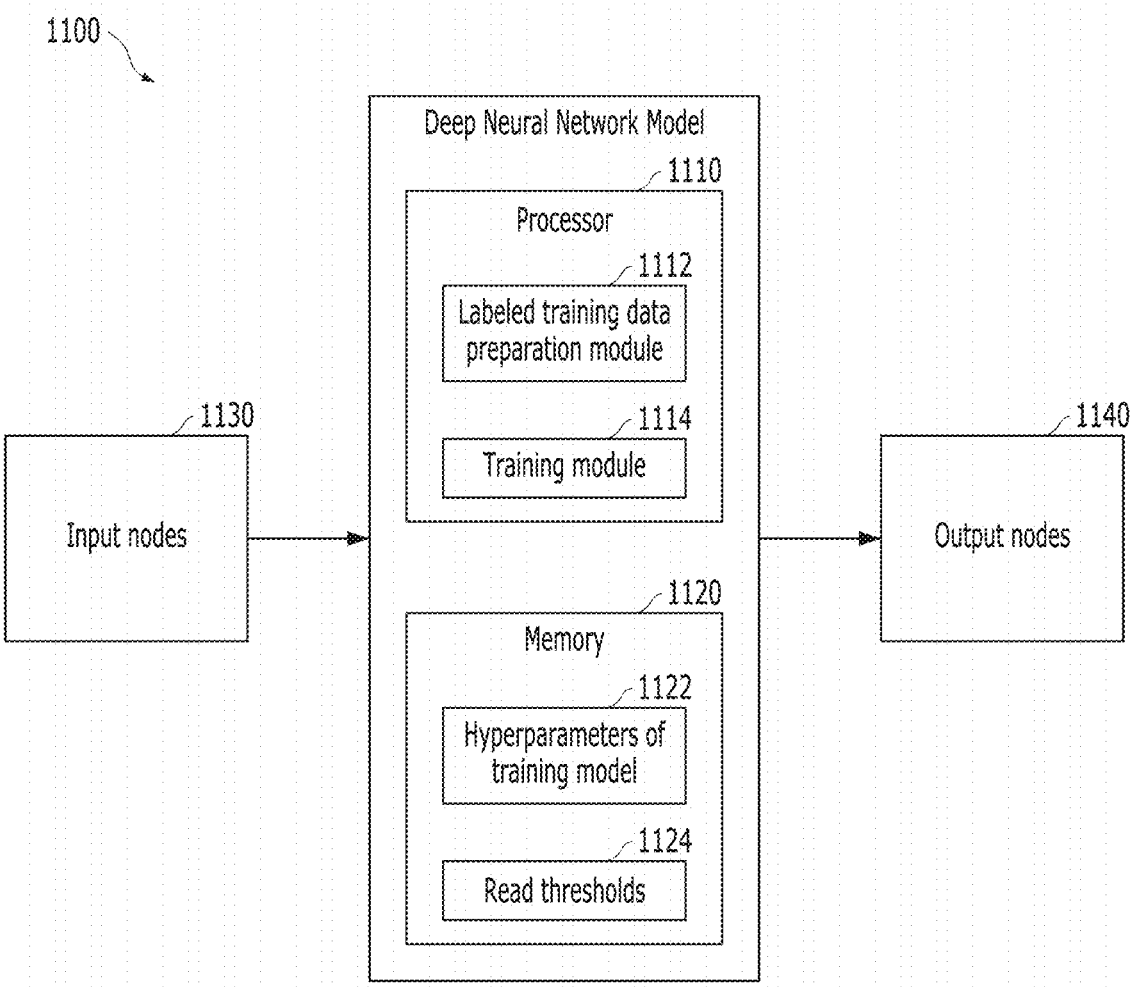

READ THRESHOLD ESTIMATION SYSTEMS AND METHODS USING DEEP LEARNING

BACKGROUND

1. Field

Embodiments of the present disclosure relate to a scheme for estimating read threshold values in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various read thresholds to perform read operations.

SUMMARY

Aspects of the present invention include a system and a method for estimating read threshold values using deep learning.

Aspects of the present invention include classifications of operating conditions that contribute to the read errors in a memory system or a data storage to train one or more deep learning algorithms, determine optimal read thresholds and estimate the best read threshold among the optimal read thresholds.

In one aspect, a memory system includes a memory device including multiple pages coupled to select word lines in a memory region and a controller. The controller performs multiple read operations on a select type of page for each word line using multiple read threshold sets; obtains fail bit count (FBC) information associated with each read operation; determines an optimal read threshold set for each word line based on the FBC information; and when optimal read threshold sets for the select word lines are different each other, predicts a best read threshold set using the optimal read threshold sets.

In another aspect, a method for operating a memory system includes: performing multiple read operations on a select type of page for each word line using multiple read threshold sets; obtaining fail bit count (FBC) information associated with each read operation; determining an optimal read threshold set for each word line based on the FBC information; and when optimal read threshold sets for the select word lines are different each other, predicting a best read threshold set using the optimal read threshold sets.

Additional aspects of the present invention will become apparent from the following description.

BRIEF DESCRIPTION OF THE DRAWINGS

FIG. 4 is a diagram illustrating distributions of states for different types of cells of a memory device.

FIG. 9 illustrates an example of a training method of the deep neural network for data storage optimization implemented based on some embodiments of the disclosed technology.

FIG. 10 illustrates an example of an inference method of the deep neural network for data storage optimization implemented based on some embodiments of the disclosed technology.

FIG. 11 illustrates an example of a deep neural network system for data storage optimization implemented based on some embodiments of the disclosed technology.

DETAILED DESCRIPTION

Figure 1:
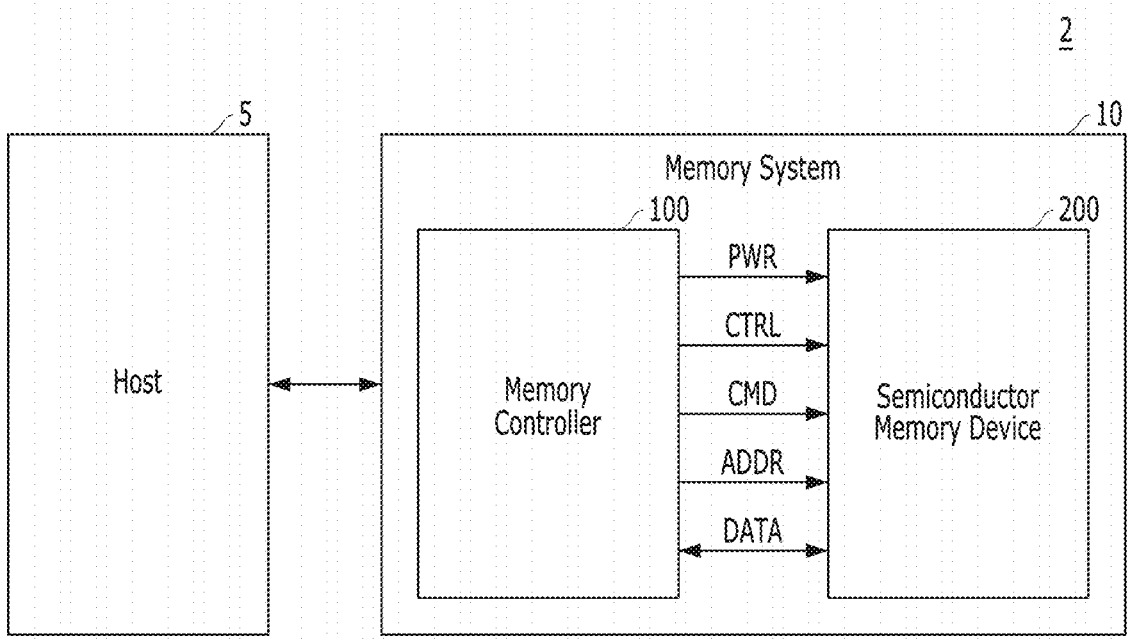
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such is embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
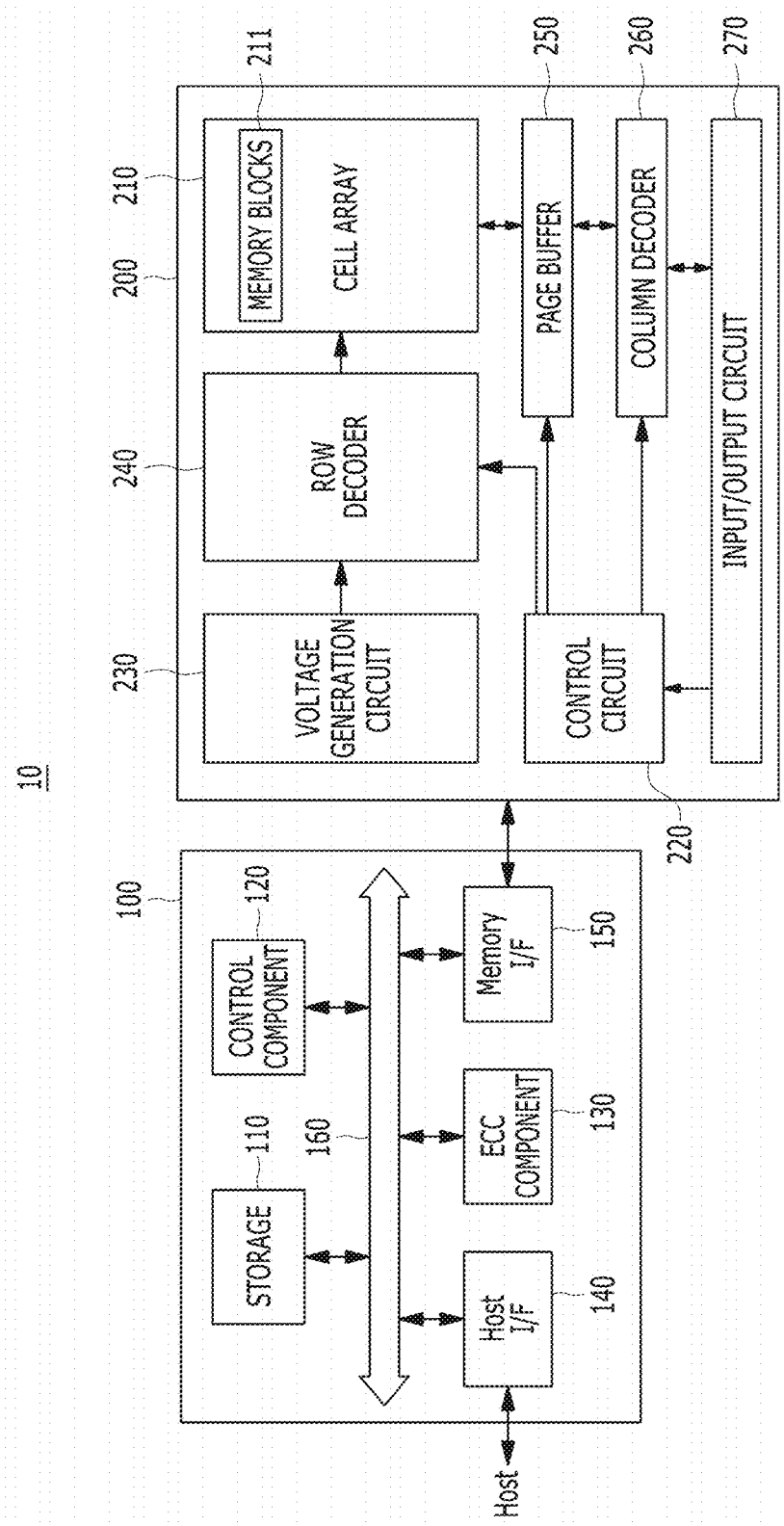
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail is signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
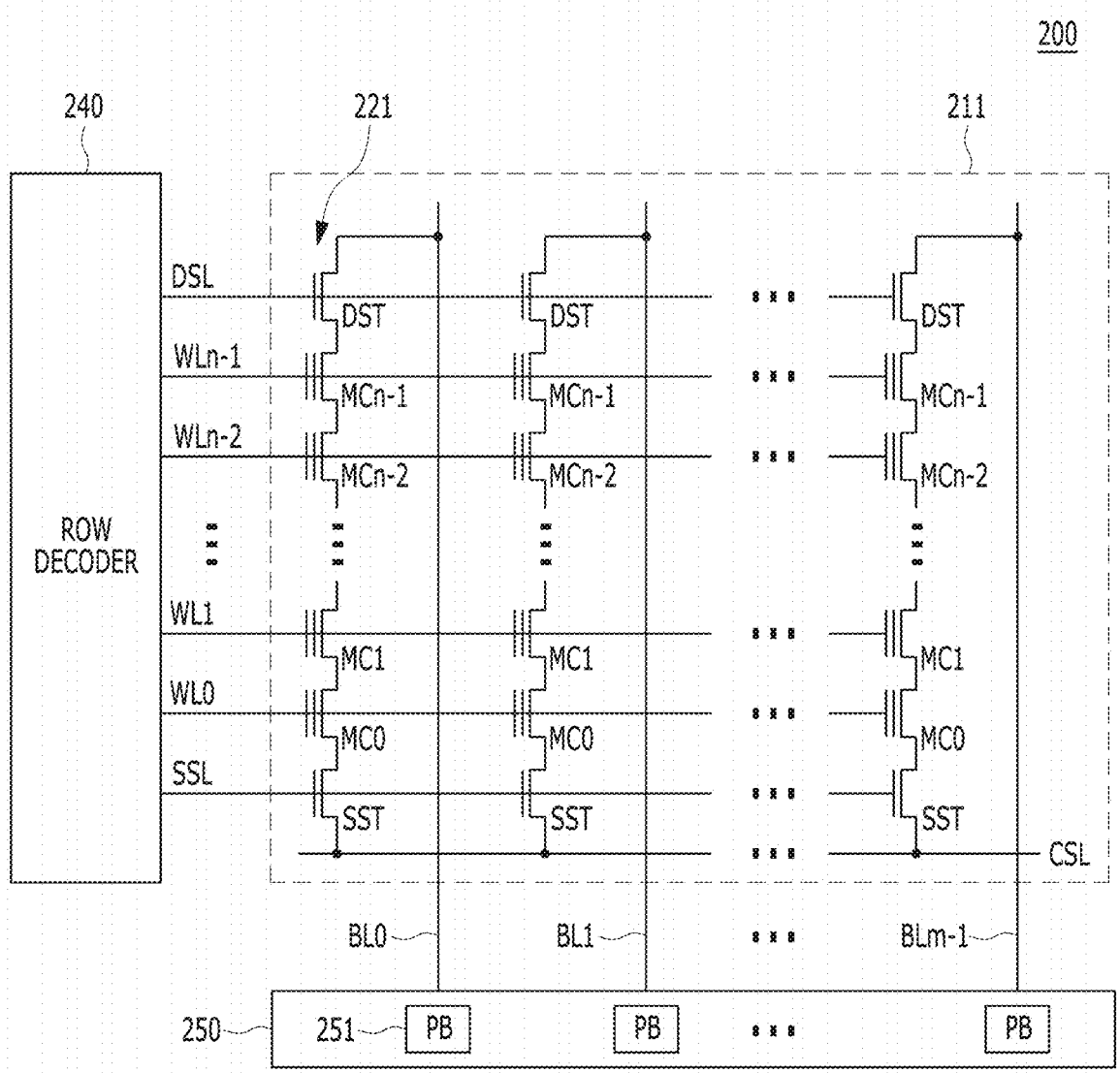
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cel (s). Memory cell array 210 may be implemented as a hybrid flash memory in which two or more types of memory cells are combined, or one-NAND flash memory in which a controller is embedded inside a memory chip.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5A:
FIG. 5A is a diagram illustrating an example of Gray coding for a multi-level cell (MLC).

FIG. 5A is a diagram illustrating an example of coding for a multi-level cell (MLC).

Referring to FIG. 5A, an MLC may be programmed using a set coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
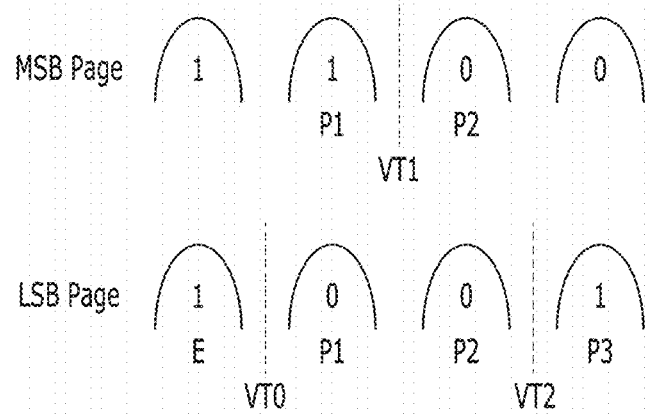
FIG. 5B is a diagram illustrating state distributions for pages of a multi-level cell (MLC).

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6A:
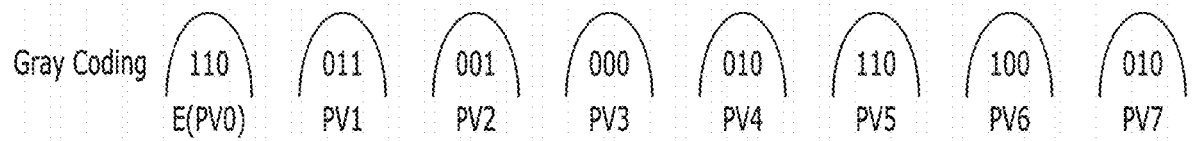
FIG. 6A is a diagram illustrating an example of Gray coding for a triple-level cell (TLC).

FIG. 6A is a diagram illustrating an example of Gray coding for a triple-level cell (TLC).

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "110." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
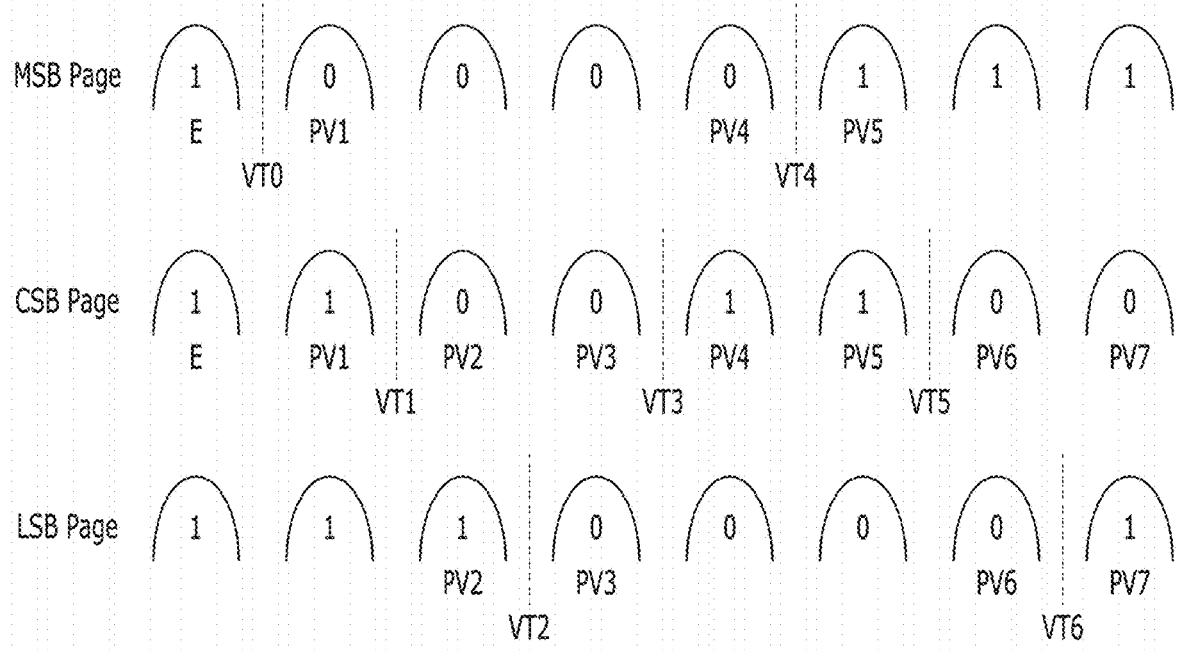
FIG. 6B is a diagram illustrating state distributions for pages of a triple-level cell (TLC).

In the TLC, as shown in FIG. 6B, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state PV1 and a threshold value VT4 that distinguishes between a fourth program state PV4 and a fifth program state PV5. For a CSB page, 3 thresholds include VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, 2 thresholds include VT2 and VT6. VT2 distinguishes between the second program state PV2 and the third program state PV3. VT6 distinguishes between the sixth program state PV6 and a seventh program state PV7.

After a memory array including a plurality of memory cells is programmed as described in FIGS. 5A and 6A, when a read operation is performed on the memory array using a certain voltage reference value such as a read threshold (i.e., read voltage level), the electrical charge levels of the memory cells (e.g., threshold voltage levels of transistors of memory cells) are compared to one or more voltage reference values (also called "read voltage level" or "read threshold") to determine the state of individual memory cells. When a certain read threshold is applied to the memory array, those memory cells that have threshold voltage levels higher than the certain voltage reference value are turned on and detected as "on" cell, whereas those memory cells that have threshold voltage levels lower than the certain voltage reference value are turned off and detected as "off" cell, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using MLC technology, the threshold voltage levels of the memory cells are compared to more than one read threshold level to determine the state of individual memory cells. Read errors can be caused by distorted or overlapped threshold voltage distribution. An ideal memory cell threshold voltage distribution can be significantly distorted or overlapped due to, e.g., program and erase (PIE) cycle, cell-to-cell interference, and data retention errors. For example, as program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using error correction codes (ECC). When the number of bit errors on a read operation exceeds the ECC correction capability of the data storage, the read operation fails.

Certain circumstances or operation conditions, such as charge leakage over time and device usage wear, can cause threshold voltages shift. Such a threshold voltage shift can produce read errors because several "off" cells may result in a threshold voltage higher than the read threshold due to the threshold voltage shift. Various circumstances can cause the threshold voltage shift to produce read errors. For example, memory devices with low endurance can produce more read errors than those with high endurance. Such a threshold voltage shift can be induced by operating conditions such as increased number of program/erase cycles of the memory array and increased operating temperature of the data storage devices. A read disturbance and the location of a memory chip or memory block may also be is considered to determine whether the threshold voltage shift is likely to occur.

The endurance of a flash memory may indicate the maximum number of program/erase operations that the flash memory is able to perform successfully. Each memory cell can only be programmed and erased a limited number of times, before it becomes potentially unusable. In some embodiments of the disclosed technology, the endurance of a flash memory indicates the maximum number of program/erase operations per set period, e.g., day. The endurance of the flash memories can be affected by structural issues such as high memory densities and operating conditions such as high program voltages.

Data retention may refer to an operating condition relating to how long memory cells maintain a correct programmed state. Data retention can vary depending on the operating temperature and the number of program/erase cycles performed on the memory cells. Subjecting memory cells subject to high temperature and a large number of program/erase operations tends to lower their data retention.

The read disturbance indicates a phenomenon where reading data from a flash cell can cause the threshold voltages of other unread cells in the same block to shift to a different (e.g., higher) value. While a single threshold voltage shift is small, when read operations are performed over time, the threshold voltage shift eventually becomes large enough to alter the states of the memory cells.

Die, block and word line indices can represent the physical location of the memory cell to be read. A data storage device can be made up of a plurality of memory chip dies, each including a plurality of memory blocks. Each memory block includes a plurality of memory cells, and each memory cell can be selected by a word line coupled thereto. A memory controller can be configured to track movement of data across the plurality of dies and the plurality of blocks. Based on the movement of data, the memory controller can determine how many program/erase operations a certain memory die or a certain memory block has performed. This information can be stored with reference to die indices, block indices, and word line indices to identify location(s) where program/erase operations is/are concentrated. The possibility of read errors would be higher when reading out data from any of those locations.

Such read errors, however, can be minimized by modifying the read thresholds. In some embodiments of the disclosed technology, the read thresholds may be modified based on operating conditions that contribute to the read errors in flash memory-based data storage SSD devices. These operating conditions include, but are not limited to, the endurance of a memory device, data retention, read disturbance, age of the associated storage device, operating is temperature of the data storage device, and the location of the memory cell to be read, which can be indicated by die indices, block indices, and/or word line indices.

Figure 7:
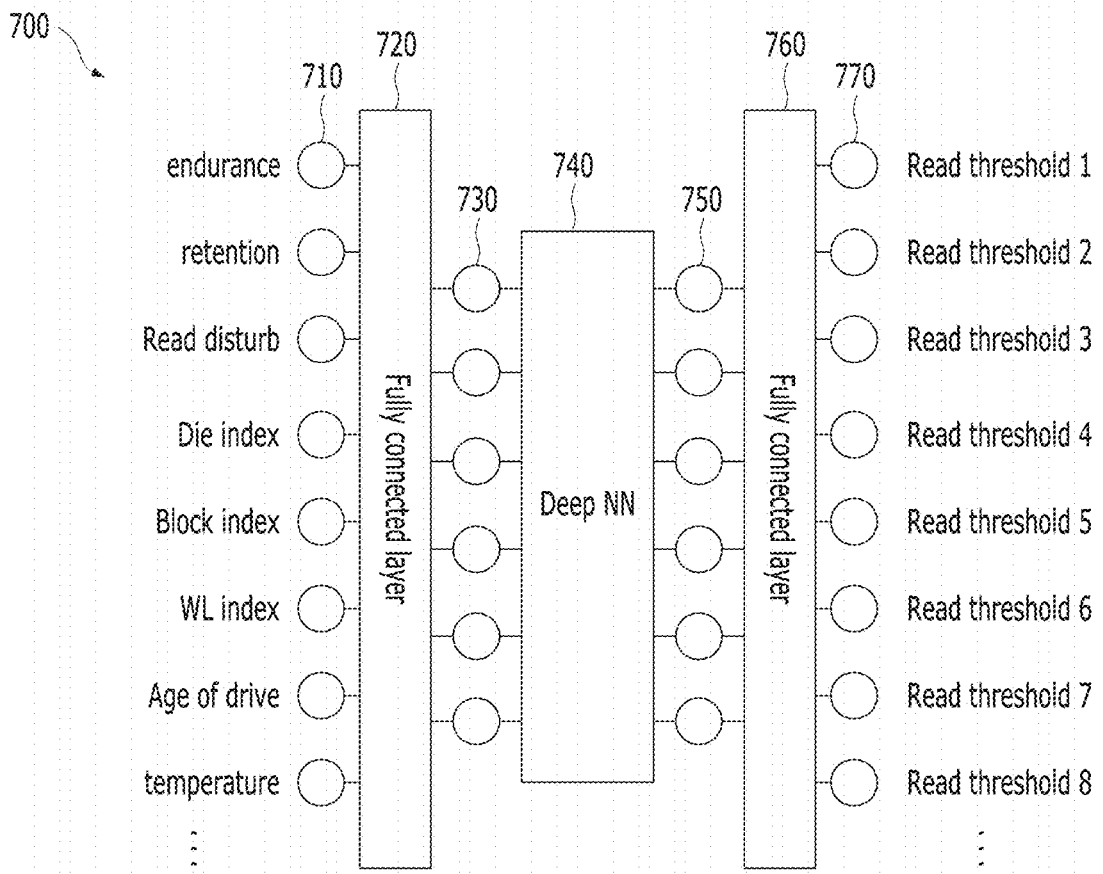
FIG. 7 illustrates an example of a deep neural network architecture for data storage performance optimization implemented based on some embodiments of the disclosed technology.
Figure 8:
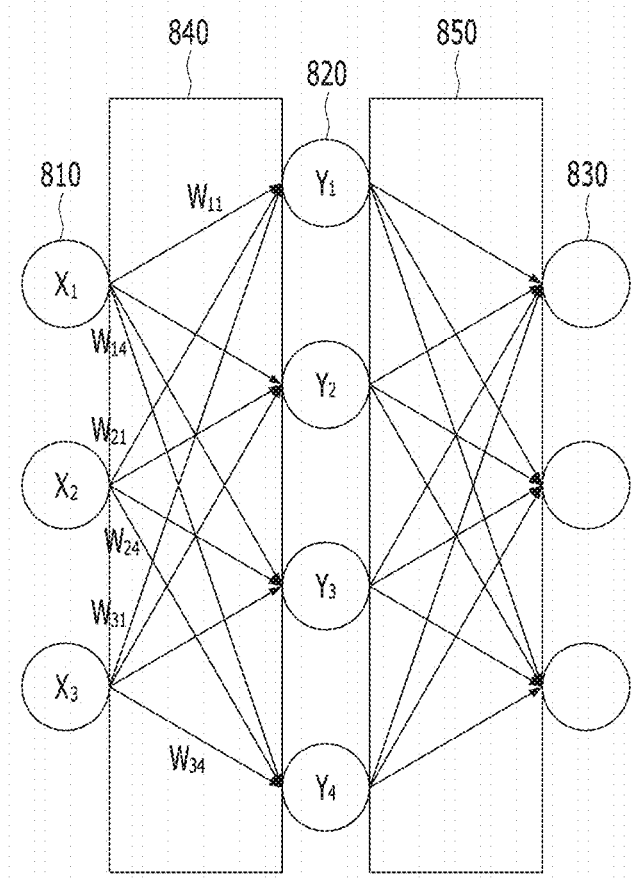
FIG. 8 illustrates an example configuration of a computational neural network including input neurons, hidden neurons, output neurons, and synapse layers.

The performance (e.g., input/output operations per second and throughput) of a data storage device such as an SSD is heavily dependent on the read threshold setting (i.e., read voltage setting) applied when the first read operation is conducted. If the read threshold is not optimized, the performance may be degraded because such unoptimized read threshold voltages can cause read errors. The optimization of the read threshold voltages depends on certain operating conditions such as physical location of data, device endurance, data retention time, operating temperature, read disturbance, and age of device. However, it is unrealistic to manually consider all the possible combinations of different operating conditions to modify the read thresholds. It would be even more difficult to manually obtain an optimized read threshold if the operating conditions change often. Accordingly, it is desirable to provide a system and a method for optimizing read threshold values using deep learning. One implementation of deep learning has a structure as shown in FIGS. 7, 8 and 11 and performs operations as shown in FIGS. 9 and 10. Such a structure is described in U.S. patent application Ser. No. 16/717,888, entitled "STORAGE DEVICE PERFORMANCE OPTIMIZATION USING DEEP LEARNING" and incorporated by reference herein.

In some embodiments of the disclosed technology, the read errors can be minimized by using a deep neural network to identify specific effects of threshold voltage shift that can occur in a memory cell array of a data storage device based on the operating conditions discussed above. In some implementations of the disclosed technology operating conditions that contribute to the threshold voltage shifts, which can result in the read errors, are classified and such operating conditions are quantified using a deep neural network. Some implementations of the disclosed technology include identifying criteria that must be met to set a read threshold at a certain value. For example, when it is determined that the criteria for the optimal read threshold is not met (e.g., when the number of errors or indication of errors from the memory device approaches an undesirably high value, a temperature value approaches a low or a high threshold value, etc.), a memory controller can obtain new values to modify the read thresholds based on the sensed operating conditions using the values that is generated by the deep learning neural network engine. The operating conditions, including a physical location of data, an endurance of the data storage device, data retention, an operating temperature, a read disturbance, and the age of the data storage device, can be used to estimate or predict the threshold voltage shift. The deep neural network may be trained based on input data collected from a large number of flash memory chip dies. For example, the deep neural network can be trained based on a limited combination of operating conditions. In an implementation, optimized read threshold voltages are computed from the trained deep neural network engine. In another implementation, the values obtained by the trained neural network engine may be stored in a memory (e.g., a lookup table) of a data storage device, and a memory controller in the data storage device may modify the read threshold voltages based on the values.

In some embodiments of the disclosed technology, a deep neural network is used to predict the optimal read threshold from the operating conditions of the storage device. In one example, the deep learning network can be used to interpolate the optimal read thresholds associated with operating conditions that do not exist in the training data set obtained from the offline memory device characterization. In some embodiments of the disclosed technology, a trained deep neural network for optimizing read threshold voltages can be obtained from an offline computing process based on a limited combination of operating conditions. Based on a larger set of operating conditions, the optimal read thresholds for all possible combinations of operating conditions can be computed by the trained deep learning network so that the optimization results may be used during actual read operations of the memory device.

FIG. 7 illustrates an example of a deep neural network architecture for data storage performance optimization implemented based on some embodiments of the disclosed technology. The deep neural network architecture 700 for data storage performance optimization includes a plurality of input nodes 710, first and second connection layers 720 and 760, a plurality of connection nodes 730 and 750, and a deep neural network 740, and a plurality of output nodes 770. Here, the first and second connection layers 720 and 760 may be fully connected layers. For example, the first connection layer 720 may be configured to connect all the input nodes 710 to all the connection nodes 730 of the deep neural network 740. Likewise, the second connection layer 760 may be configured to connect all the output nodes 770 to all the connection nodes 750 of the deep neural network 740. In some embodiments of the disclosed technology, the input and output nodes 710 and may be input neurons and output neurons, and the first and second connection layers 720 and 760 may be synapse layers, as will be discussed below.

The already-trained deep neural network 740, through the plurality of input nodes 710, the first connection layer 720, and the first connection nodes 730, receives the operating conditions that contribute to the read errors, such as endurance, retention, read disturbance, die index, block index, word line index, age of the data storage drive, and/or temperature. The deep neural network 740 measures data in the memory devices under combinations of operating conditions using a set of read thresholds. For example, the deep neural network 740 may read out data from a certain memory cell of the data storage device under the combination of the operating conditions, including the endurance of the memory device the certain memory cell belongs to, the data retention of the memory device the certain memory cell belongs to, an expected read disturbance associated with the certain memory cell, the age of the data storage, the operating temperature of the data storage, and the physical location of the certain memory cell, which can be determined based on the die index, the block index, and the word line index. For operating conditions with continuous values, some implementation examples of the disclosed deep neural network only select or extract discrete values. In this way, the optimal read threshold can be obtained from the already-trained deep neural network. In an implementation, the thresholds voltages optimized corresponding to each combination of operating conditions may be stored in a memory (e.g., SRAM) of the storage device.

FIG. 8 illustrates an example configuration of a computational neural network including input neurons 810, hidden neurons 820, output neurons 830, and synapse layers 840 and 850. For example, the synapse layer 840 may include a plurality of weights $W_{11}$, $W_{12}$, $W_{13}$, $W_{14}$, $W_{21}$, $W_{22}$, $W_{23}$, $W_{24}$, $W_{31}$, $W_{32}$, $W_{33}$, and $W_{34}$. The input neurons 810 receive some values and propagate them to the hidden neurons 820 of the network. The weighted sums from one or more layers of hidden neurons 820 are ultimately propagated to the output neurons 830. Here, the outputs of the neurons are often referred to as activations, and the synapses are often referred to as weights. An example of the computation at each layer can be expressed as:

$$Yj=f(\Sigma_{i=1}^{3} Wij \times Xi+b) \quad \text{(Eq. 1)}$$

where Wji, Xi and Yj are the weights, input activations and output activations, respectively.

In some embodiments of the disclosed technology, input parameters such as endurance, retention, read disturbance, die index, block index, word line index, age of the data storage drive, and temperature are fed into the first layer of a deep neural network, and the outputs of that layer can be interpreted as representing the presence of different features that contribute to the threshold voltage shifts. At subsequent layers, these features are then combined into a measure of the likely presence of higher level features, which are further combined to provide a probability that these high-level features require read threshold modifications.

In some embodiments of the disclosed technology, the neural network algorithm for data storage performance optimization includes determining the value of the weights (and bias) in the neural network and is referred to as training the network. Once trained, the program can perform its task by computing the output of the neural is network using the weights determined during the training process. Running the program with these weights is referred to as inference. There are multiple ways to train the weights. A supervised learning is an approach where all the training samples are labeled. Unsupervised learning is another approach where all the training samples are not labeled and essentially the goal is to find the structure or clusters in the data. A semi-supervised learning falls in between the two approaches where only a small subset of the training data is labeled.

FIG. 9 illustrates an example of a training method 900 of the deep neural network for data storage optimization implemented based on some embodiments of the disclosed technology. First, where the operating conditions have continuous values, discrete values are selected out of continuous values of operating conditions that contribute to the read errors in the data storage devices. At step 910, data in the memory devices are read out under certain combinations of operating conditions using a first set of read threshold voltages. For example, threshold voltages of memory cells of the memory device are measured under certain combinations of operating conditions using the first set of read threshold voltages. In an implementation, threshold voltages of memory cells are measured under certain combinations of discrete values of operating conditions using a set of read thresholds. At step 920, proper read thresholds are found to produce a labeled training data set. At step 930, the number of layers and the size of each layer are determined to construct a deep neural network engine based on characteristics of the memory device. For example, the number of layers and the size of each layer are decided as hyperparameters of a deep neural network engine. Some examples of the deep neural network engine may include at least two layers, N input nodes, and M output nodes. Here, N is the number of conditions considered and M is the number of different read threshold settings considered. The number of layers and size of each layer depends on the characteristics of the memory cell. Upon determination of the number of layers and size of each layer, layers and input/output nodes of the deep neural network engine are configured. At step 940, the deep neural network engine is trained using the labeled training data set corresponding to optimal read thresholds. At step 950, the trained deep neural network engine is used to compute read thresholds voltage values under a larger set of operating conditions.

In some embodiments of the disclosed technology, a deep neural network engine for data storage performance optimization can be designed to help identify the most influential operating conditions in determining the amount of threshold voltage shift to select an optimized read threshold for a given threshold voltage distribution windows. Based on these features, machine learning techniques can be utilized to decide the optimized read threshold, minimizing the read errors. In an implementation, the optimized read thresholds associated with the labeled training data set can be stored in a memory (e.g., SRAM) in the storage device.

FIG. 10 illustrates an example of an inference method 1000 of the deep neural network for data storage optimization implemented based on some embodiments of the disclosed technology. At step 1010, the current operating conditions are fed into the input nodes of the trained deep neural network. At step 1020, the optimal read thresholds are obtained from output nodes of the trained deep neural network. At step 1030, read thresholds are modified to the optimal read thresholds. At step 1040, data can be read out from the memory cell using the optimal read thresholds.

FIG. 11 illustrates an example of a deep neural network system 1100 for data storage optimization implemented based on some embodiments of the disclosed technology. The deep neural network 1100 may include one or more processors 1110 and one or ore memory devices 1120 operatively coupled to the one or more processors 1110. One or more of the processors 1110 may be operable to receive a plurality of operating conditions that contribute to the read errors in the data storage devices. Some of the operating conditions that contribute to the read errors include endurance, retention, read disturbance, die index, block index, word line index, age of the data storage drive, and operating temperature. One or more of the processors 1110 may be operable to predict the optimal read threshold from the operating conditions of the storage device. For example, one or more of the processors may utilize a deep learning algorithm to interpolate the optimal read thresholds associated with operating conditions that do not exist in the training data set obtained from the offline memory device characterization.

In some embodiments of the disclosed technology, one or more of the processors 1110 may be operable to measure a threshold voltage of a memory cell under certain combinations of operating conditions. One or more of the processors 1110 may be operable to find an optimal read threshold for each threshold voltage distribution to produce a labeled training data set. In one example, one or more of the processors 1110 may include a labeled training data preparation module 1112 configured to produce the labeled training data set. One or more of the processors 1110 may be operable to configure input nodes 1130 to receive and output nodes 1140. For example, one or more of the processors 1110 may be operable to configure N input nodes and N output nodes, where N is the number of operating conditions considered and M is the number of different read threshold settings considered. One or more of the processors 1110 may be operable to decide hyperparameters of the deep neural network. One or more of the processors may be operable to train based on the labeled training data set. In one example, one or more of the processors 1110 may include a training module 1114 configured to train based on the labeled training data set. In some embodiments of the disclosed technology, one or more of the memory devices 1120 may be configured to store a set of hyperparameters of a training model 1122 and read thresholds 1124.

One or more of the processors 1110 may be operable to obtain, from the output nodes, the optimal read thresholds corresponding to the combinations of the operating conditions fed to the input nodes. The optimal read thresholds and their corresponding combinations of the operating conditions may be used to compute optimal thresholds voltages of the memory devices in the data storage device. In an implementation, the data storage device is operable to decide the read thresholds using the trained deep neural network engine.

As described above, in order to optimize read threshold voltage values, the deep learning framework of FIG. 7 uses features such as NAND conditions (i.e. endurance, retention, read disturb, age of drive, temperature) and physical locations of data (i.e., die index, block index, WL index). During the data analysis of the deep learning framework, inventors found that the deep learning framework can be further improved by resolving the following issues with the deep learning framework of the related application:

(1) The deep learning framework can only utilize a small portion of the entire data set. For example, the deep learning framework only uses the optimal (or optimum) read retry threshold (RRT) entry as the labelled data in the training, among the total 50 RRT entries. The other 49 measured data points with sub-optimal RRT in the data set are not used. In other words, only 2% of the entire data set is used. Since only a limited amount of data in the data set is used in the training, the performance of the deep neural network (DNN) may be lower.

(2) In accordance with the typical read scheme, the controller 120 of FIG. 2, which corresponds to the deep neural network model of FIG. 11, may control a read operation for the memory cells using a select (e.g., historical) read threshold voltage (Vt) set. For example, the historical read threshold set may be the read threshold voltage set used in the last successful decoding. When the read operation using all of the voltages in the select read threshold set fails, the controller 120 may control one or more read retry operations for the memory cells using one or more read retry threshold voltage sets. When all read retry operations using the voltages of the read retry threshold voltage sets fails, the controller 120 may perform an optimal read threshold voltage search. In this read scheme, a certain number of pages, for example pages in a block or a die, share the same read threshold voltage set. Inventors observed that, among pages that share the same read threshold voltage set, there is a large variation as to the optimal read threshold voltage sets found for the different pages. These variations can be resolved by keeping track of the history of reads for every single page. However, this tracking is not practical because of the memory overhead incurred. The optimal read threshold voltage is not consistent and is noisy due to the read-to-read noise from the memory device (e.g., a NAND memory device). However, training to find an optimal read threshold voltage set in such noisy data set is not a good idea.

Accordingly, embodiments herein provide an improved deep learning framework, in which each page could potentially have different threshold voltage set without storing such information in the memory (e.g., DRAM).

Figure 12A:
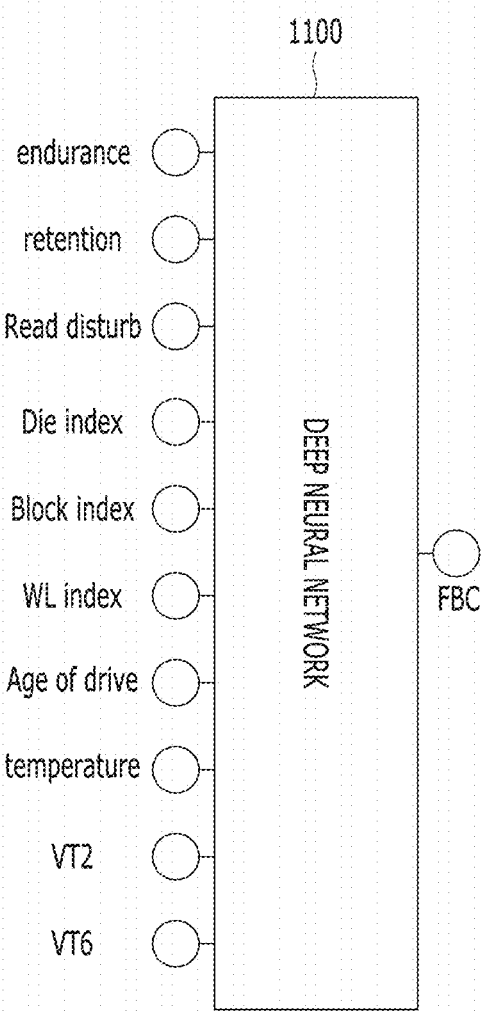
FIGS. 12A to 12C illustrate architectures of a deep neural network in accordance with an embodiment of the present invention.
Figure 12B:
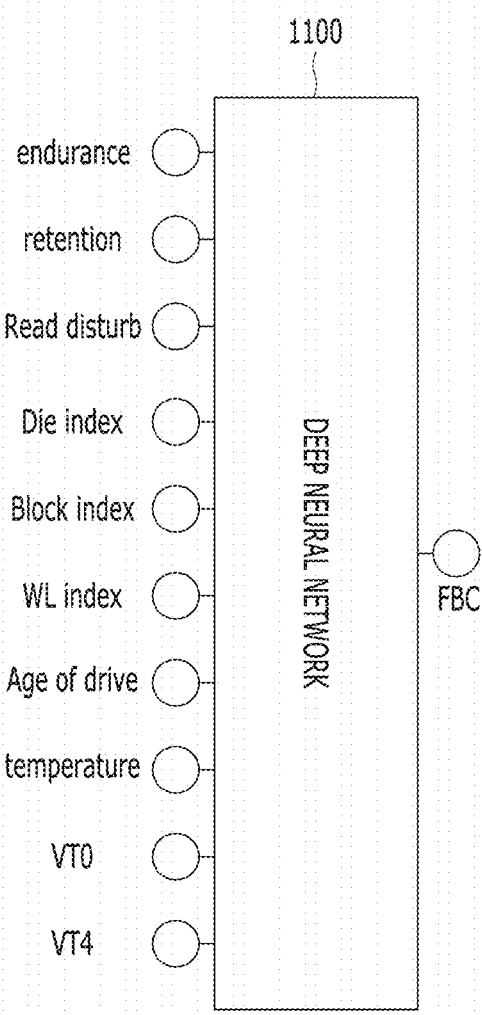
Figure 12C:
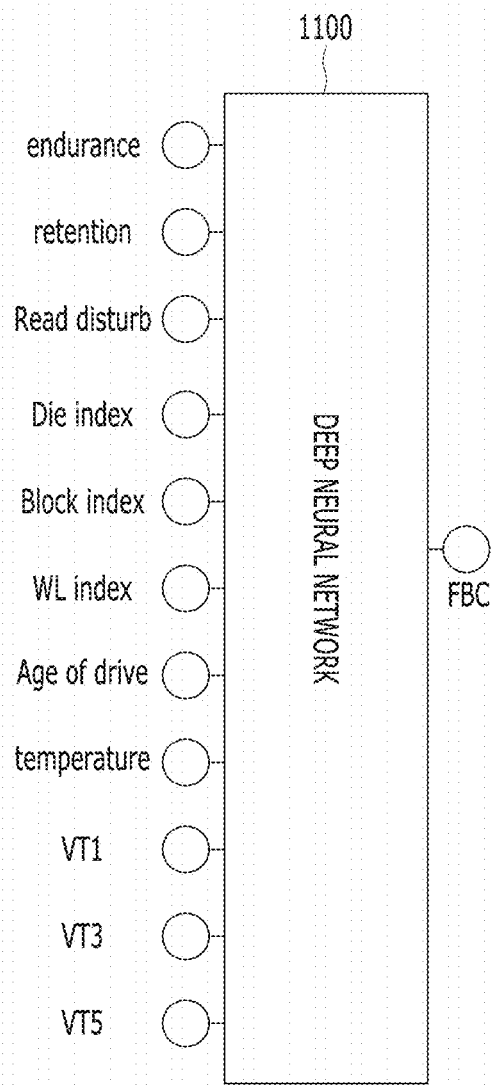

FIGS. 12A to 12C illustrate architectures of the deep neural network 1100 in accordance with an embodiment of the present invention.

Referring to FIGS. 12A to 12C, the deep neural network (DNN) 1100 may receive a plurality of operating conditions that contribute to read errors in a data storage device (e.g., a memory system of FIG. 2). The operating conditions may include conditions of an associated memory device (i.e., NAND) such as endurance, retention, read disturbance, age of the data storage device (or drive) and operating temperature, and physical locations of data to be read such as die index, block index and word line index, as shown in FIG. 7. Further, the operating conditions may include a read threshold voltage set and error information associated with data read from the memory device using the read threshold voltage set. In the illustrated example of FIG. 12A, the read threshold voltage set may be [VT2, VT6] for an LSB page of a TLC. In the illustrated example of FIG. 12B, the read threshold voltage set may be [VT0, VT4] for an MSB page of the TLC. In the illustrated example of FIG. 12C, the read threshold voltage set may be [VT1, VT3, VT5] for a CSB page of the TLC. In some embodiments, the error information may be a fail bit count (FBC) which is obtained from decoding for read data from the memory device using the read threshold voltage set provided to the DNN 1100. As such, the deep neural network 1100 may have a regression deep learning framework, which is operable to predict the optimal read thresholds from the operating conditions including a read threshold voltage set and error information as well as other operating conditions, as shown in FIG. 7. For example, the deep neural network 1100 may utilize a deep learning algorithm to interpolate optimal read thresholds associated with operating conditions from training data set obtained from the offline memory device characterization, where the optimal read thresholds do not exist in the training data set.

Figure 13:
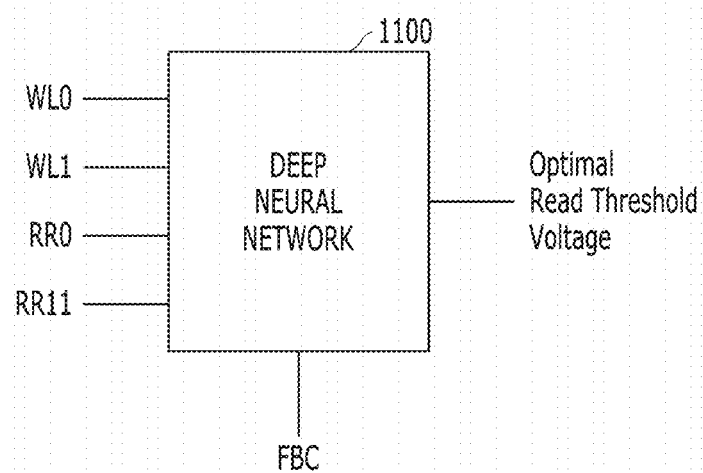
FIG. 13 illustrates a simplified architecture of a deep neural network in accordance with an embodiment of the present invention.

FIG. 13 illustrates a simplified architecture of the deep neural network 1100 in accordance with an embodiment of the present invention. The deep neural network 1100 may be implemented with the storage 110 and the control component 120 of the controller 100 in FIG. 2 or the processor 1110 and the memory 1120 of FIG. 11. Although FIG. 13 illustrates that the deep neural network 1100 uses only some pieces of data among all data illustrated in FIG. 12A, it is noted that all data of FIG. 12A may be used in training of optimal read threshold voltages.

In FIG. 13, it is assumed that pages of the same type may be read from different word lines within the same memory region (e.g., block or page) of a TLC memory device, with all read retry table (RRT) entries. In some embodiments, LSB pages coupled to two adjacent word lines WL0 and WL1 may be read using a total of 50 RRT entries. After performing the read operation, error information for LSB page of each word line may be obtained. For example, error information (given as a fail bit count (FBC)) for LSB page of WL0 may be FBC=199 at RR0 and FBC=200 at RR11. For another example, error information for LSB page of WL1 may have FBC=311 at RR0 and FBC=210 at RR11. It is assumed that RR0 may be a set of VT2=0.5 and VT6=3.5, and RR11 may be a set of VT2=−0.2 and VT6=2.9. In this case, as the optimal read threshold voltage set for each word line, the deep neural network 1100 may select the read threshold voltage set corresponding to a relatively low value of FBC, among two read threshold voltage sets. As for WL0, the deep neural network 1100 may select the read threshold voltage set RR0 (i.e., VT2=0.5 and VT6=3.5), which corresponds to the lowest value (i.e., FBC=199) among two FBC values 199, 200. As for WL1, the deep neural network 1100 may select the read threshold voltage set RR11 (i.e., VT2=−0.2 and VT6=2.9), which corresponds to the lowest value (i.e., FBC=210) among two FBC values 311, 210. As such, two labelled data points at RR0 and at RR11 may be used in training data of LSB pages in different locations of the same memory region.

Typically, the same optimal read threshold voltage set is used for different locations (i.e., pages) as well as the same location within the same memory region. Thus, these two labelled data points RR0 (i.e., VT2=0.5, VT6=3.5) and RR11 (i.e., VT2=−0.2, VT6=2.9) are contradicting with each other and causes confusion to the deep neural network 1100. In this case, the deep neural network 1100 may determine that the best read threshold voltage set (VT2, VT6) is in the middle as a compromise between the self-conflicting data points. In some embodiments, the deep neural network 1100 may determine the best read threshold voltage set (VT2, VT6) as an average (0.15, 3.2) of the two data points RR0 (i.e., VT2=0.5, VT6=3.5) and RR11 (i.e., VT2=−0.2, VT6=2.9).

In this case, FBC at the read threshold voltage set (i.e., VT2=0.15, VT6=3.2) is higher than FBC (i.e., 199) at the read threshold voltage set RR0 on WL0 (i.e., VT2=0.5, VT6=3.5). Thus, given the fact that the deep neural network 1100 obtains FBC=200 at RR11 on WL0, the deep neural network 1100 should predict (or estimate) the optimal read threshold voltage set (VT2, VT6) to be around RR11. Further, FBC at the read threshold voltage set (i.e., VT2=0.15, VT6=3.2) is higher than FBC (i.e., 210) at the read threshold voltage set RR11 on WL1 (i.e., VT2=−0.2, VT6=2.9). Thus, given the fact that the deep neural network 1100 obtains FBC=311 at RR0 on WL1, the deep neural network 1100 should predict (or estimate) the optimal read threshold voltage set (VT2, VT6) to be around RR0. These examples show how the sub-optimal FBC information can help the deep neural network 1100 find a better prediction of the optimal (or best) read threshold voltage set. In other words, by knowing FBC information in additional to the optimal read threshold voltage values for each word line, the deep neural network 1100 may learn how FBC value changes over different threshold voltage values and hence provide much more robust estimation.

As described above, the architecture of FIGS. 12A to 13, uses all data including optimal read threshold voltage values for each word line and error information (i.e., FBC), as the labelled data in the training of optimal read threshold voltages and thus the prediction accuracy may be improved.

In some embodiments, the deep neural network 1100 may be implemented as a system on a chip (SoC) in order to get an estimate of error information (i.e., FBC value) in a relatively short period of time, i.e., low latency. The controller 100 of FIG. 2 or the processor 1110 of FIG. 11 may use the SoC-implemented deep neural network 1100 to get an estimate of FBC for a certain read threshold voltage (VT) set and decide what read threshold voltage to use. For example, firmware (FW) of the controller 100 may try to get FBC values for all 50 RRT entries and predict the best read threshold voltage set based on the FBC values as well as other measured data associated with operation conditions, as shown in FIGS. 12A to 13.

In the typical NAND device, the read threshold voltage set is stored in the NAND and all the pages in a memory region (i.e., a die or a block) shared the same read threshold voltage set. In accordance with embodiments, every read command may have different read threshold voltages, and different read threshold voltage sets may be used for different pages. When the controller 100 needs to change the read threshold voltage set, the controller 100 may transmit a set command (e.g., a setParam command) to the memory device 200 (e.g., NAND) to update the read threshold voltage set. Frequent use of the command to change the read threshold voltage set in the NAND will affect performance of the NAND. Thus, the NAND will need to support per command VT adjustment by using values in the command field.

Figure 14:
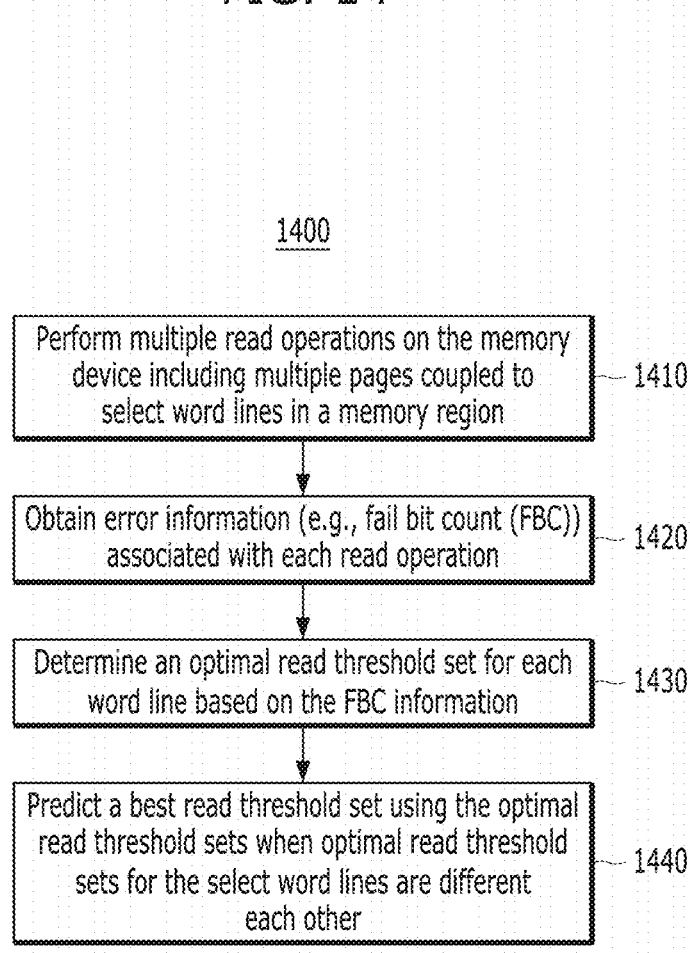
FIG. 14 is a flowchart illustrating a read threshold estimation operation in accordance with an embodiment of the present invention.

FIG. 14 is a flowchart illustrating a read threshold estimation operation 1400 in accordance with an embodiment of the present invention. The read threshold estimation operation 1400 may be performed by firmware of the controller 100 in FIG. 2 using the deep neural network 1100 of FIGS. 12A to 13. By way example and without any limitation, the read threshold estimation operation 1400 is applied to LSB pages of TLC. However, the read threshold estimation operation 1400 may be applied to other pages (i.e., MSB and CSB pages) of TLC, pages (i.e., MSB, LSB, CMSB and CLSB pages) of QLC or other types of NANDs consistent with the teachings herein.

Referring to FIG. 14, at step 1410, the controller 100 may perform multiple read operations on the memory device including multiple pages coupled to select word lines in a memory region. In some embodiments, the controller 100 may perform multiple read operations on a select (e.g., LSB) page for each word line in the memory region using multiple read threshold sets. The multiple pages may be programmed using a set coding scheme (e.g., Gray coding). The select word lines may be two adjacent word lines within the memory region (e.g., a block or a die). Each read threshold set includes a pair of first and second read thresholds. For example, a read threshold set for LSB page includes a pair of first and second read thresholds (VT2, VT6), as shown in FIG. 6B.

At step 1420, the controller 100 may obtain error information associated with each read operation. In some embodiments, the error information may be fail bit count (FBC) information, which is obtained from decoding data associated with each read operation.

At step 1430, the controller 100 may determine an optimal read threshold set for each word line based on the FBC information. Further, the controller 100 may determine whether optimal read threshold sets for the select word lines are different from each other.

At step 1440, the controller 100 may predict a best read threshold set using the optimal read threshold sets when optimal read threshold sets for the select word lines are different each other. In some embodiments, the best read threshold set may be predicted using an average of the optimal read threshold sets. The best read threshold set may be predicted through training the optimal read threshold sets and operating conditions including endurance of memory device, data retention, read disturbance, age of the memory device, and/or operating temperature of the memory device.

After the best read threshold set is predicted, the controller 100 may transmit a set command to the memory device to select the best read threshold set from among the optimal read threshold sets. The predicted best read threshold set is then used for all word lines.

Figure 15:
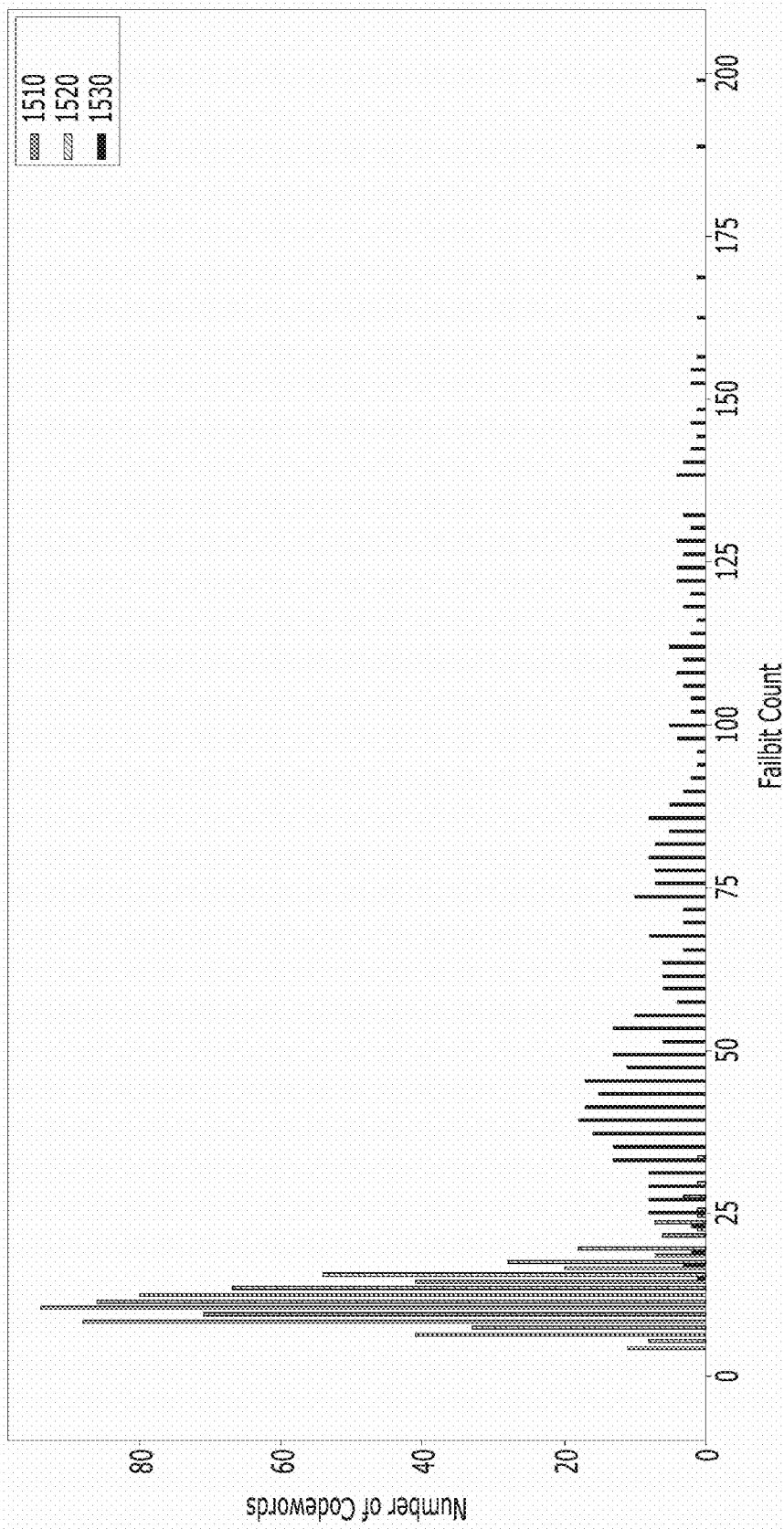
FIG. 15 is a graph illustrating improved read performance using a deep neural network in accordance with an embodiment of the present invention.

FIG. 15 is a graph illustrating improved read performance using the deep neural network 1100 in accordance with an embodiment of the present invention.

In FIG. 15, x-axis represents fail bit count (FBC) and y-axis represents the number of codewords. That is, FIG. 15 illustrates a histogram of FBC. 1510 means the FBC histogram obtained by using the optimal Vt. 1520 means the FBC histogram obtained by using Vt predicted by the deep neural network (DNN). 1530 means the FBC histogram obtained by per block and per page-type based optimal Vt. It resembles the FBC from a practical FW policy.

As described above, embodiments provide a regression deep learning framework to predict optimal read threshold voltages to improve the performance of the memory system.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including multiple pages coupled to select word lines in a memory region; and
   a controller, coupled to the memory device, suitable for:

performing multiple read operations on a select type of page for each word line using multiple read threshold sets;

obtaining fail bit count (FBC) information associated with the multiple read operations, the FBC information including multiple FBC values corresponding to the multiple read threshold sets;

selecting a lowest FBC value among the multiple FBC values;

determining, using a neural network, a read threshold set corresponding to the lowest FBC value as an optimal read threshold set for each word line, wherein the neural network utilizes suboptimal FBC information in addition to the optimal read threshold set to predict the optimal read threshold set; and when optimal read threshold sets for the select word lines are different each other, predicting, using the neural network, a best read threshold set using the optimal read threshold sets.

2. The memory system of claim 1, wherein the memory region includes a block or a die.

3. The memory system of claim 1, wherein the select word lines includes two adjacent word lines.

4. The memory system of claim 1, wherein the multiple pages include a most significant bit (MSB) page, a center significant bit (CSB) page and a least significant bit (LSB) page.

5. The memory system of claim 4, wherein the multiple pages is programmed using Gray coding.

6. The memory system of claim 5, wherein the select type of page includes the LSB page.

7. The memory system of claim 6, wherein each read threshold set includes a pair of first and second read thresholds.

8. The memory system of claim 1, wherein the best read threshold set is predicted using an average of the optimal read threshold sets.

9. The memory system of claim 1, wherein the controller predicts the best read threshold set using the optimal read threshold sets and operating conditions including at least one of endurance of memory device, data retention, read disturbance, age of the memory device, or operating temperature of the memory device.

10. The memory system of claim 1, wherein the controller transmits a set command to the memory device to select the best read threshold set from among the optimal read threshold sets.

11. A method for operating a memory system, which includes a memory device including multiple pages coupled to select word lines in a memory region, and a controller coupled to the memory device, the method comprising:

performing multiple read operations on a select type of page for each word line using multiple read threshold sets;

obtaining fail bit count (FBC) information associated with the read operations, the FBC information including multiple FBC values corresponding to the multiple read threshold sets;

selecting a lowest FBC value among the multiple FBC values;

determining, using a neural network, a read threshold set corresponding to the lowest FBC value as an optimal read threshold set for each word line based on the FBC information, wherein the neural network utilizes suboptimal FBC information in addition to the optimal read threshold set to predict the optimal read threshold set; and when optimal read threshold sets for the select word lines are different each other, predicting, using the neural network, a best read threshold set using the optimal read threshold sets.

12. The method of claim 11, wherein the memory region includes a block or a die.

13. The method of claim 11, wherein the select word lines includes two adjacent word lines.

14. The method of claim 11, wherein the multiple pages include a most significant bit (MSB) page, a center significant bit (CSB) page and a least significant bit (LSB) page.

15. The method of claim 14, wherein the multiple pages is programmed using Gray coding.

16. The method of claim 15, wherein the select type of page includes the LSB page.

17. The method of claim 16, wherein each read threshold set includes a pair of first and second read thresholds.

18. The method of claim 11, wherein the best read threshold set is predicted using an average of the optimal read threshold sets.

19. The method of claim 11, wherein the predicting of the best read threshold set includes:

predicting the best read threshold set using the optimal read threshold sets and operating conditions including at least one of endurance of the memory device, data retention, read disturbance, age of the memory device, or operating temperature of the memory device.

20. The method of claim 11, further comprising:

transmitting a set command to the memory device to select the best read threshold set from among the optimal read threshold sets.

* * * * *